United States Patent
Antonyan

(10) Patent No.: US 10,762,932 B2
(45) Date of Patent: *Sep. 1, 2020

(54) MEMORY DEVICE AND OPERATING METHOD OF MEMORY DEVICE

(71) Applicant: Samsung Electronics Co., Ltd., Suwon-si, Gyeonggi-do (KR)

(72) Inventor: Artur Antonyan, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/433,178

(22) Filed: Jun. 6, 2019

(65) Prior Publication Data

US 2019/0287574 A1    Sep. 19, 2019

Related U.S. Application Data

(63) Continuation of application No. 15/989,340, filed on May 25, 2018, now Pat. No. 10,360,948.

(30) Foreign Application Priority Data

Jun. 26, 2017  (KR) .................. 10-2017-0080526
Feb. 7, 2018   (KR) .................. 10-2018-0015247

(51) Int. Cl.
| | | |
|---|---|---|
| *G11C 5/14* | (2006.01) | |
| *G11C 16/30* | (2006.01) | |
| *G11C 7/22* | (2006.01) | |
| *G11C 7/12* | (2006.01) | |
| *G11C 29/02* | (2006.01) | |
| *G11C 11/16* | (2006.01) | |
| *G11C 8/08* | (2006.01) | |
| *G11C 8/10* | (2006.01) | |

(52) U.S. Cl.
CPC .............. *G11C 5/145* (2013.01); *G11C 5/147* (2013.01); *G11C 7/12* (2013.01); *G11C 7/22* (2013.01); *G11C 8/08* (2013.01); *G11C 8/10* (2013.01); *G11C 11/1657* (2013.01); *G11C 11/1673* (2013.01); *G11C 11/1675* (2013.01); *G11C 11/1697* (2013.01); *G11C 16/30* (2013.01); *G11C 29/021* (2013.01); *G11C 29/028* (2013.01)

(58) Field of Classification Search
None
See application file for complete search history.

(56) References Cited

U.S. PATENT DOCUMENTS

| | | | |
|---|---|---|---|
| 6,385,109 | B1 | 5/2002 | Naji |
| 6,496,436 | B2 | 12/2002 | Naji |
| 7,280,388 | B2 | 10/2007 | Nahas |
| 7,880,531 | B2 | 2/2011 | Park |
| 8,107,280 | B2 | 1/2012 | Yoon et al. |
| 8,320,167 | B2 | 11/2012 | Rao et al. |

(Continued)

*Primary Examiner* — Tan T. Nguyen

(57) ABSTRACT

A memory device includes a memory cell array that includes memory cells, a row decoder that is connected to the memory cell array through word lines, a column decoder that is connected to the memory cell array through bit lines and source lines, a write driver that transfers a write voltage to a bit line, which is selected by the column decoder, from among the bit lines by using a gate voltage in a write operation, and control logic that generates the gate voltage. The gate voltage is higher than the write voltage.

20 Claims, 12 Drawing Sheets

(56) References Cited

U.S. PATENT DOCUMENTS

| | | |
|---|---|---|
| 8,339,889 B2 | 12/2012 | Cho |
| 8,400,824 B2 | 3/2013 | Rho |
| 8,773,934 B2 | 7/2014 | Tran |
| 8,842,484 B2 | 9/2014 | Kwon et al. |
| 9,558,832 B2 | 1/2017 | Katou |
| 9,583,171 B2 | 2/2017 | Kim et al. |
| 9,704,919 B1* | 7/2017 | Lu .................. H01L 27/228 |
| 10,388,348 B2* | 8/2019 | Shimizu .............. G11C 29/14 |
| 2002/0044482 A1* | 4/2002 | Viehmann ............ G11C 11/16 365/158 |
| 2007/0291531 A1 | 12/2007 | Nahas |
| 2011/0280057 A1* | 11/2011 | Kim .................... G11C 29/02 365/148 |
| 2013/0311717 A1* | 11/2013 | Kim .................. G11C 11/1693 711/104 |
| 2013/0329489 A1* | 12/2013 | Kim .................. G11C 11/1659 365/158 |
| 2013/0343117 A1* | 12/2013 | Lua .................. G11C 11/1673 365/158 |
| 2018/0075890 A1* | 3/2018 | Inaba ................ G11C 11/1675 |
| 2018/0075897 A1 | 3/2018 | Shimizu |
| 2019/0051351 A1* | 2/2019 | Pyo .................. G11C 13/0028 |

\* cited by examiner

MEMORY DEVICE AND OPERATING METHOD OF MEMORY DEVICE

CROSS-REFERENCE TO RELATED APPLICATIONS

This U.S. non-provisional application is a continuation of U.S. patent application Ser. No. 15/989,340, filed May 25, 2018, which itself claims priority under 35 U.S.C. § 119 to Korean Patent Application No. 10-2017-0080526 filed on Jul. 26, 2017 and Korean Patent Application No. 10-2018-0015247 filed on Feb. 7, 2018, in the Korean Intellectual Property Office, the disclosures of which are incorporated herein in their entireties by reference.

BACKGROUND

Embodiments of the inventive concept described herein relate to a semiconductor device, and more particularly, relate to a memory device and an operating method of the memory device.

A memory device may include memory cells and may store data in the memory cells. A memory device that needs power for the purpose of retaining data stored in memory cells is called a "volatile memory device". A memory device that does not need power for the purpose of retaining data stored in memory cells is called a "nonvolatile memory device".

An operation of storing data in a memory cell is called a "write operation". To perform a write operation, a memory device may apply a write voltage or a write current to memory cells. In general, the portion of the memory device which generates a write voltage or a write current occupies a large portion of the area of the memory device and consumes a lot of power.

As a speed to adjust or recover a write voltage or a write current to a target value in the memory device becomes higher, speed and stability of the write operation may be further secured. Accordingly, there is the consistent demand on a memory device to occupy a reduced area, reduce power consumption, and to quickly adjust and recover a voltage or a current when generating the write voltage or the write current.

Also, as memory devices are designed to be suitable for low power, the power supply voltage for the memory devices is decreasing. A write voltage or a write current of a given level may have to be secured to perform a write operation on memory cells. Therefore, there is consistent demand on a memory device capable of securing a necessary level of a write voltage or a write current even though the power supply voltage decreases.

SUMMARY

Embodiments of the inventive concept provide a memory device that generates a write voltage having an improved adjustment and recovery speed by using the reduced area and power and an operating method of the memory device.

Embodiments of the inventive concept also provide a memory device that solves a voltage headroom problem and secures a higher write voltage and an operating method of the memory device.

According to some embodiments, a memory device includes a memory cell array that includes a plurality of memory cells, a row decoder that is connected to the memory cell array through a plurality of word lines, a column decoder that is connected to the memory cell array through a plurality of bit lines and a plurality of source lines, a write driver that transfers a write voltage to a bit line of the plurality of bit lines. The bitline is selected by the column decoder, from among the plurality of bit lines by using a gate voltage in a write operation, and control logic that generates the gate voltage. The gate voltage is higher or greater than the write voltage.

According to some embodiments, a memory device includes a memory cell array that includes a plurality of memory cells, a row decoder that is connected to the memory cell array through a plurality of word lines, a column decoder that is connected to the memory cell array through a plurality of bit lines and/or a plurality of source lines, a write driver that transfers a write voltage to a bit line of the plurality of bit lines, which is selected by the column decoder, from among the bit lines by using a gate voltage in a write operation, and control logic that generates the gate voltage. The control logic includes a reference resistance element that is connected between a comparison node and a ground node, a transmission gate that is connected to the comparison node and operates in response to first and second enable signals, a gate transistor that is connected between a power node and the transmission gate and operates in response to the gate voltage, a comparator that compares a reference voltage and a comparison voltage of the comparison node and outputs a third enable signal depending on a result of the comparison, and a charge pump that generates the gate voltage in response to the third enable signal.

According to some embodiments, an operating method of a memory device which includes memory cells includes adjusting a reference voltage, adjusting a resistance value of a reference resistance element from a first resistance value to a second resistance value, adjusting a capacity of a charge pump from a first capacity to a second capacity, comparing a comparison voltage generated by the reference resistance element having the second resistance value with the reference voltage, activating or deactivating the charge pump having the second capacity based on a result of the comparing in order to adjust a gate voltage from a first gate voltage to a second gate voltage, and supplying a write voltage to one or more of the memory cells depending on the second gate voltage.

BRIEF DESCRIPTION OF THE FIGURES

The above and other objects and features of the inventive concept will become apparent by describing in detail example embodiments thereof with reference to the accompanying drawings.

DETAILED DESCRIPTION

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Below, embodiments of the inventive concept may be described in detail and clearly to such an extent that an ordinary one of skill in the art easily implements the inventive concept.

Figure 1:
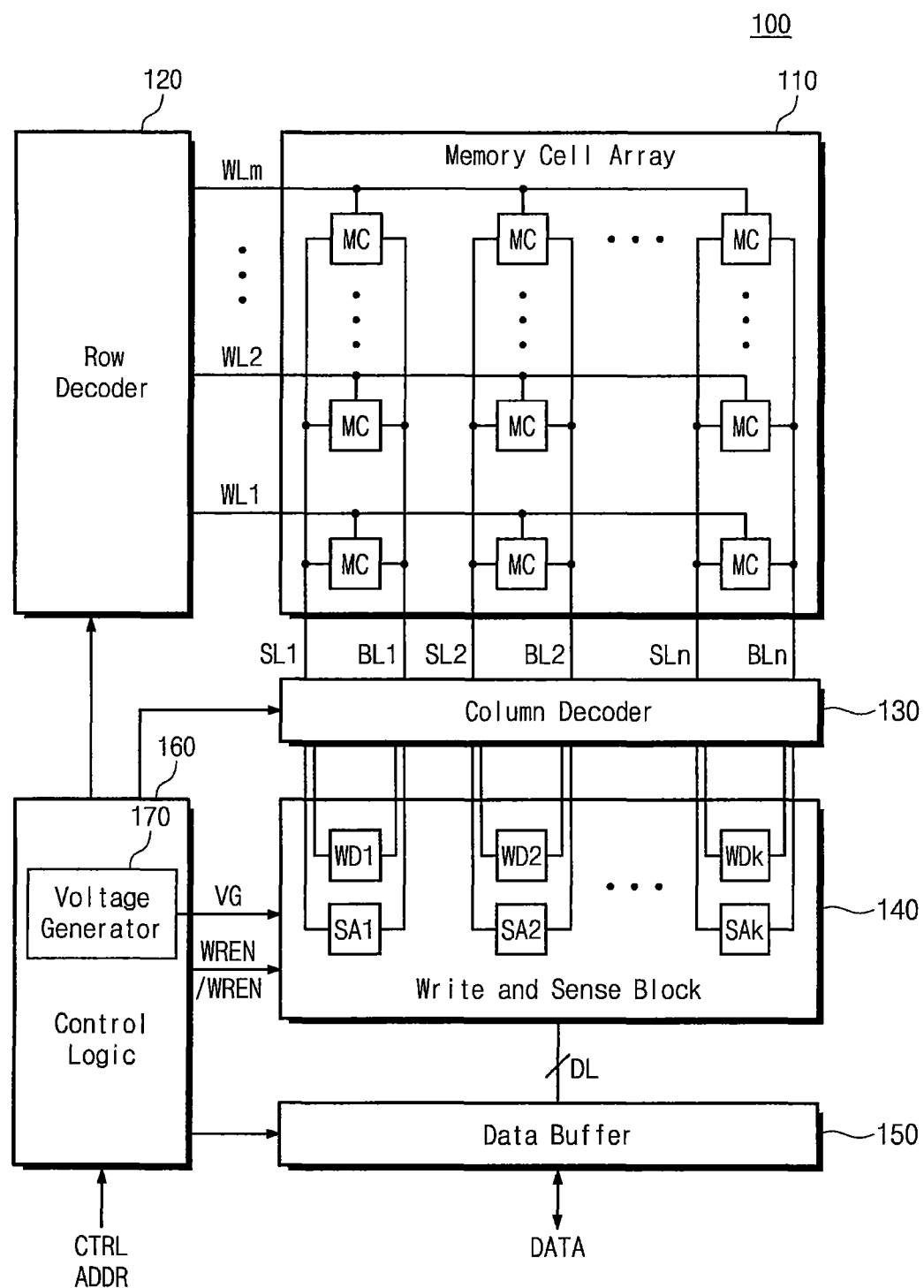
FIG. 1 illustrates a memory device according to some embodiments of the present inventive concepts.

FIG. 1 illustrates a memory device 100 according to an embodiment of the inventive concept. The memory device 100 may include a volatile memory device such as a dynamic random access memory (DRAM) device, a static RAM (SRAM) device, etc. The memory device 100 may include a nonvolatile memory device such as a flash memory device, a magnetic RAM (MRAM) device, a phase-change RAM (PRAM) device, a ferroelectric RAM (FRAM) device, and/or a resistive RAM (RRAM) device.

Below, it is assumed that the memory device 100 is the MRAM device. However, the inventive concept is not limited to the MRAM device. The inventive concept may be applied to various memory devices such as a volatile memory device or any other nonvolatile memory device.

Referring to FIG. 1, the memory device 100 may include a memory cell array 110, a row decoder 120, a column decoder 130, a write and sense block 140, a data buffer 150, and control logic 160.

The memory cell array 110 includes memory cells MC. The memory cells MC are connected to source lines SL1 to SLn (n being a positive integer), bit lines BL1 to BLn, and word lines WL1 to WLm (m being a positive integer). The memory cells MC may be arranged in rows and columns. The rows of the memory cells MC may be respectively connected to the word lines WL1 to WLm. The columns of the memory cells MC may be respectively connected to the source lines SL1 to SLn and the bit lines BL1 to BLn.

The row decoder 120 may control voltages of the word lines WL1 to WLm under control of the control logic 160. For example, the row decoder 120 may apply a selection voltage for read or write to a selected word line and may apply a non-selection voltage (or voltages) for read or write inhibition to unselected word lines.

The column decoder 130 is connected to the source lines SL1 to SLn and the bit lines BL1 to BLn. The column decoder 130 is connected with the write and sense block 140. Under control of the control logic 160, the column decoder 130 may electrically connect the write and sense block 140 with one or more source lines selected from the source lines SL1 to SLn and one or more bit lines selected from the bit lines BL1 to BLn.

Under control of the control logic 160, the column decoder 130 may apply bias voltages to unselected source lines of the source lines SL1 to SLn and unselected bit lines of the bit lines BL1 to BLn. The bias voltages may be determined not to have an influence on a write operation or a read operation of selected memory cells connected to the selected word line, the selected bit lines, and/or the selected source lines and may include, for example, a ground voltage.

The write and sense block 140 includes write drivers WD1 to WDk (k being a positive integer) and sense amplifiers SA1 to SAk. In a write operation, the write drivers WD1 to WDk may be connected with selected bit lines and selected source lines through the column decoder 130. For example, each of the write drivers WD1 to WDk may be connected to one selected bit line and one selected source line.

The write drivers WD1 to WDk may write data in selected memory cells MC. For example, when a state of a specific memory cell is different from a state that data to be written in the specific memory cell indicates, a write driver associated with the specific memory cell may change the state of the specific memory cell.

For example, upon changing data of the specific memory cell, a write driver associated with the specific memory cell may supply a write voltage to one of a source line and a bit line connected with the specific memory cell and may supply a low voltage, for example, a ground voltage to the other thereof.

When the state of the specific memory cell is identical to the state that data to be written in the specific memory cell indicates, the write driver associated with the specific memory cell may maintain the state of the specific memory cell without change. Upon maintaining the data of the specific memory cell without change, the write driver associated with the specific memory cell may supply a write inhibit voltage to prevent, inhibit and/or reduce a further write operation, for example, the ground voltage to the source line and the bit line connected with the specific memory cell.

In a read operation, the sense amplifiers SA1 to SAk may be connected with selected bit lines and selected source lines through the column decoder 130. For example, each of the sense amplifiers SA1 to SAk may be connected to one selected bit line and one selected source line.

In the write operation, the write drivers WD1 to WDk may receive a gate voltage VG, a write enable signal WREN, and/or an inverted write enable signal /WREN from the control logic 160. The write drivers WD1 to WDk may output write voltages in response to the gate voltage VG, the write enable signal WREN, and/or the inverted write enable signal /WREN.

For example, the write drivers WD1 to WDk may supply the write voltages to selected bit lines and selected source lines. For example, in the write operation of switching states of the memory cells MC from first states (e.g., a low resistance state or a high resistance state) to second states (e.g., a high resistance state or a low resistance state), the write drivers WD1 to WDk may supply write voltages to selected bit lines.

For example, in the write operation of switching states of the memory cells MC from the second states to the first states, the write drivers WD1 to WDk may supply write voltages to selected source lines.

The data buffer 150 is connected with the write and sense block 140 through data lines DL. The data buffer 150 may exchange data "DATA" with an external device (e.g., a memory controller) under control of the control logic 160. For example, in the write operation, the data buffer 150 may provide data "DATA" received from the external device to the write drivers WD1 to WDk. In the read operation, the data buffer 150 may output data "DATA" provided from the sense amplifiers SA1 to SAk to the external device.

The control logic 160 may receive a control signal CTRL and an address ADDR from the external device (e.g., a memory controller). In response to the control signal CTRL and the address ADDR, the control logic 160 may control the row decoder 120, the column decoder 130, the write and sense block 140, and the data buffer 150 so as to perform the write operation and the read operation.

The control logic 160 may provide the write enable signal WREN and the inverted write enable signal /WREN to the write and sense block 140. The write enable signal WREN and the inverted write enable signal /WREN may be complementary signals. When performing the write operation, the control logic 160 may set the write enable signal WREN to a high level and the inverted write enable signal /WREN to a low level.

The control logic 160 may include a voltage generator 170. The voltage generator 170 may generate the gate voltage VG in the write operation. The gate voltage VG may be provided to the write and sense block 140. The gate voltage VG may be used for the write drivers WD1 to WDk to generate write voltages. A level of the gate voltage VG may be higher than a level of the write voltage or a level of a power supply voltage of the memory device 100.

The write drivers WD1 to WDk may generate write voltages having the same or similar level by using the gate voltage VG. Since the gate voltage VG is higher than the write voltage or the power supply voltage, the write drivers WD1 to WDk may generate the write voltages having a level that approximates to a level of the power supply voltage.

Also, the write drivers WD1 to WDk may quickly adjust a level of a write voltage to a target level and may quickly recover the level of the write voltage to the target level when the level of the write voltage fluctuates (or changes). Since the gate voltage VG is higher than the write voltage or the power supply voltage, the write drivers WD1 to WDk may solve a problem of voltage headroom in order to keep current source transistors in saturation mode in the event of a small voltage drop.

Figure 2:
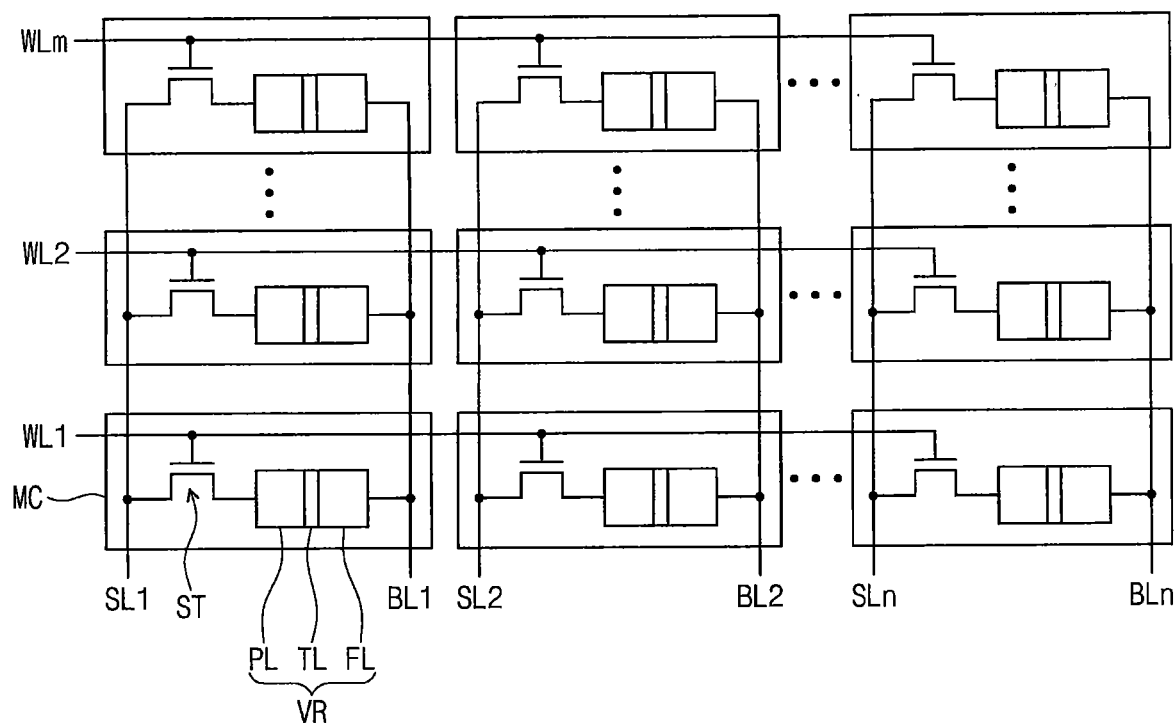
FIG. 2 illustrates an example of memory cells of a memory cell array according to some embodiments of the present inventive concepts.
Figure 3:
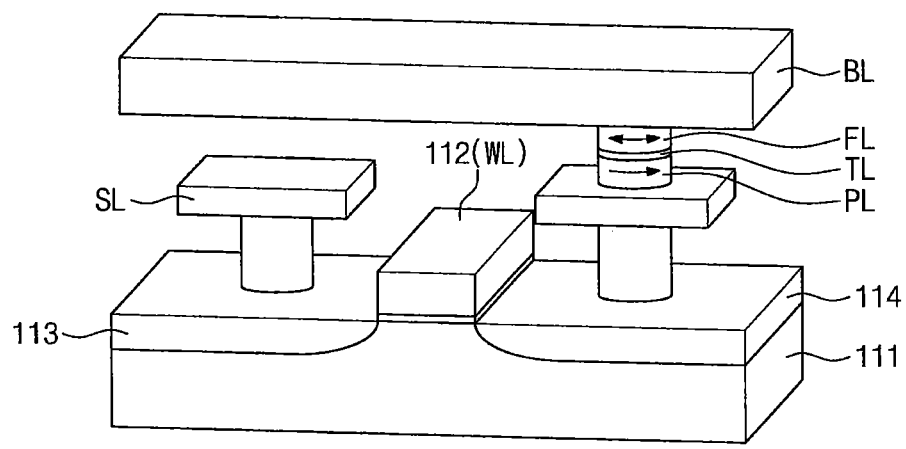
FIG. 3 illustrates an example of one of memory cells according to some embodiments of the present inventive concepts.

FIG. 2 illustrates an example of the memory cells MC of the memory cell array 110. FIG. 3 illustrates an example of one of the memory cells MC. Referring to FIGS. 1 to 3, one memory cell includes a selection transistor ST and a variable resistance element VR.

The selection transistor ST includes a first junction 113 formed in a body 111 and connected with a source line SL, a second junction 114 formed in the body 111 and connected with a bit line BL through the variable resistance element VR, and a gate 112 formed on the body 111 between the first and second junctions 113 and 114 and forming a word line WL.

The variable resistance element VR includes a pinned layer PL, a tunneling layer TL, and a free layer FL. The pinned layer PL has a fixed magnetization direction. The free layer FL has a magnetization direction that varies with a voltage (or a current) applied to the variable resistance element VR.

A resistance of the variable resistance element VR may vary with whether the magnetization direction of the free layer FL is identical to the magnetization direction of the pinned layer PL (or how much the magnetization direction of the free layer FL is identical to the magnetization direction of the pinned layer PL or with whether the magnetization direction of the free layer FL is different from the magnetization direction of the pinned layer PL (or how much the magnetization direction of the free layer FL is different from the magnetization direction of the pinned layer PL). The variable resistance element VR may store data in the form of a magnitude of resistance based on values of the data.

For example, if a write voltage is applied to the bit line BL and a low voltage (e.g., a ground voltage) is applied to the source line SL, a current may flow from the bit line BL to the source line SL. In this case, the magnetization direction of the free layer FL may be opposite to the magnetization direction of the pinned layer PL. The variable resistance element VR or the memory cell MC may be set to a high resistance state (e.g., a second state).

If the write voltage is applied to the source line SL and the low voltage (e.g., the ground voltage) is applied to the bit line BL, a current may flow from the source line SL to the bit line BL. In this case, the magnetization direction of the free layer FL may be the same as the magnetization direction of the pinned layer PL. The variable resistance element VR or the memory cell MC may be set to a low resistance state (e.g., a first state).

Figure 4:
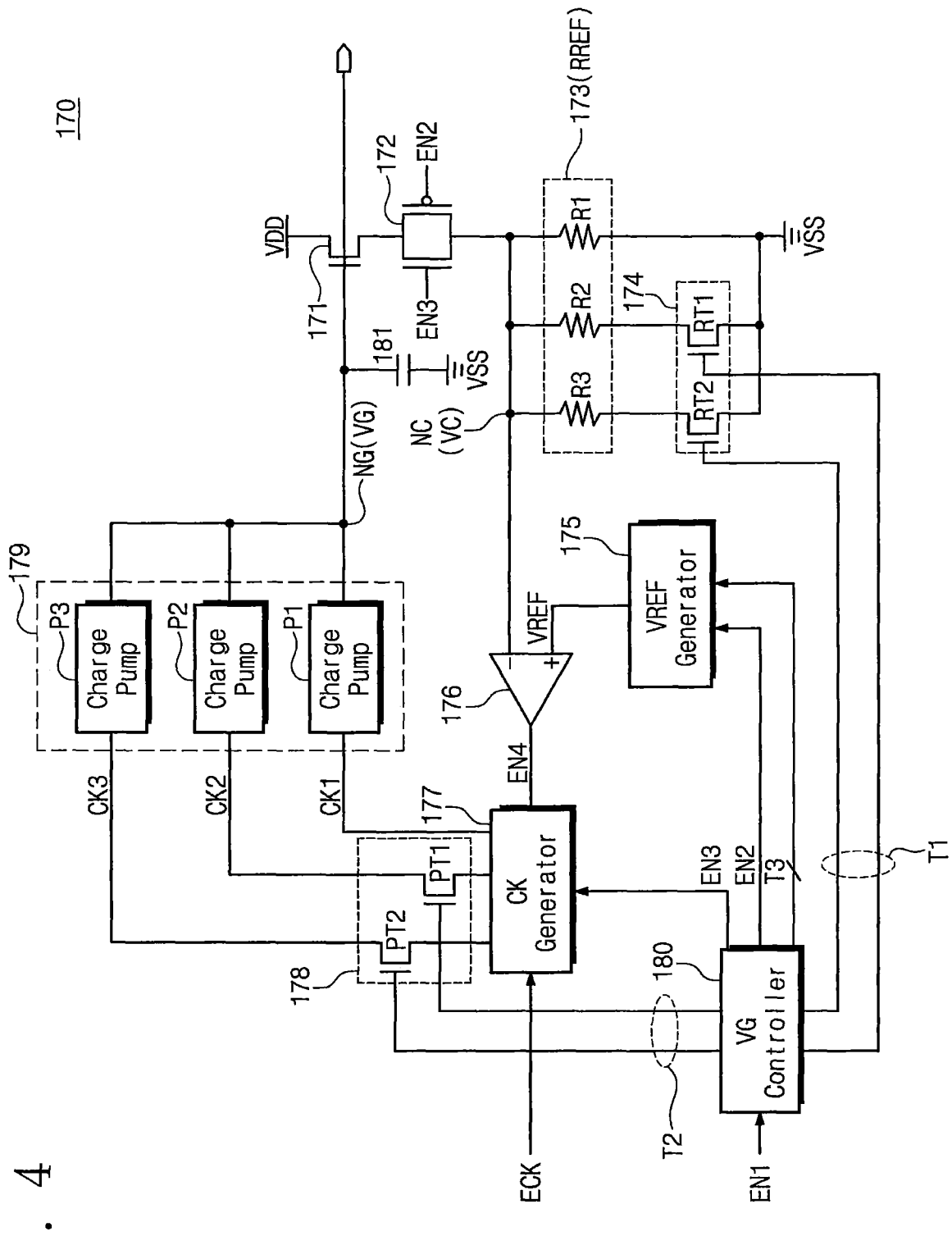
FIG. 4 illustrates a voltage generator according to some embodiments of the present inventive concepts.

FIG. 4 illustrates the voltage generator 170 according to some embodiments of the inventive concept. Referring to FIGS. 1 and 4, the voltage generator 170 includes a gate transistor 171, a transmission gate 172, a reference resistance element (RREF) 173, a resistance transistor block 174, a reference voltage generator 175, a comparator 176, a clock generator 177, a pump transistor block 178, a charge pump block 179, a gate voltage controller 180, and a capacitor 181.

The gate transistor 171 has a first end connected with a power node supplied with a power supply voltage VDD, a second end connected to the transmission gate 172, and a gate connected to a gate node NG. The gate transistor 171 may operate in response to the gate voltage VG of the gate node NG.

The gate transistor 171 may include an NMOS transistor. That is, the gate transistor 171 may form a source follower with regard to the gate voltage VG. Accordingly, the gate transistor 171 may have low output impedance and a fast adjustment and recovery speed without including an element, which occupies the large area, such as a capacitor.

The transmission gate 172 may have a first end connected to the gate transistor 171, a second end connected to a comparison node NC, and gates to which a second enable signal EN2 and a third enable signal EN3 are respectively applied. The third enable signal EN3 may correspond to an inverted version of the second enable signal EN2.

The transmission gate 172 may have a structure in which a PMOS transistor operating in response to the second enable signal EN2 and an NMOS transistor operating in response to the third enable signal EN3 are connected in parallel.

The reference resistance element 173 is connected between the comparison node NC and a ground node supplied with a ground voltage VSS. A resistance value of the reference resistance element 173 may be adjusted by the resistance transistor block 174. The reference resistance element 173 may include first to third resistors R1 to R3. The first resistor R1 may be directly connected between the comparison node NC and the ground node.

The second resistor R2 and the third resistor R3 are connected to the ground node through the resistance transistor block 174. Resistance values of the second and third resistors R2 and R3 may be applied or may not be applied to a resistance value of the reference resistance element 173 by the resistance transistor block 174.

The resistance transistor block 174 may adjust a resistance value of the reference resistance element 173 by applying or not applying the resistance values of the second and third resistors R2 and R3 to the reference resistance element 173. The resistance transistor block 174 includes a first resistance transistor RT1 and a second resistance transistor RT2 that are controlled by a first trim signal T1.

The first resistance transistor RT1 may be connected between the second resistor R2 and the ground node. The second resistance transistor RT2 may be connected between the third resistor R3 and the ground node. The first and second resistance transistors RT1 and RT2 may adjust the resistance value of the reference resistance element 173 under control of the gate voltage controller 180.

Some embodiments are described as the reference resistance element 173 includes the first to third resistors R1 to R3 and the resistance transistor block 174 includes the first and second resistance transistors RT1 and RT2. However, the number of resistors included in the reference resistance element 173 and/or the number of resistance transistors included in the resistance transistor block 174 are not limited thereto.

The reference voltage generator 175 may receive a third trim signal T3 and the second enable signal EN2 from the gate voltage controller 180. When the second enable signal EN2 is activated (e.g., to a low level), the reference voltage generator 175 may output a reference voltage VREF. The reference voltage generator 175 may adjust a level of the reference voltage VREF depending on the third trim signal T3. The reference voltage VREF may be provided to a positive input of the comparator 176.

The comparator 176 may compare a comparison voltage VC and the reference voltage VREF. For example, when the comparison voltage VC is not lower than the reference voltage VREF, the comparator 176 may set a fourth enable signal EN4 to the low level. For example, when the comparison voltage VC is lower than the reference voltage VREF, the comparator 176 may set the fourth enable signal EN4 to a high level.

The clock generator 177 may receive an external clock signal ECK from an external device (e.g., a memory controller). For example, the external clock signal ECK may be received in a state where it is included in the control signal CTRL. The clock generator 177 may receive the third enable signal EN3 from the gate voltage controller 180 and may receive the fourth enable signal EN4 from the comparator 176.

When the third enable signal EN3 is activated (e.g., to the high level), the clock generator 177 may be activated. When activated, the clock generator 177 may generate first to third clock signals CK1 to CK3 in response to the fourth enable signal EN4 and the external clock signal ECK.

For example, when the third enable signal EN3 is activated (e.g., to the high level) and the fourth enable signal EN4 is activated (e.g., to the high level), the clock generator 177 may generate the first to third clock signals CK1 to CK3 from the external clock signal ECK and may output the first to third clock signals CK1 to CK3.

When the third enable signal EN3 is activated (e.g., to the high level) and the fourth enable signal EN4 is deactivated (e.g., to the low level), the clock generator 177 may not output the first to third clock signals CK1 to CK3.

The charge pump block 179 (i.e. a charge pump) may adjust a level of the gate voltage VG in response to the fourth enable signal EN4. For example, when the fourth enable signal EN4 is activated (e.g., to the high level), the charge pump block 179 may increase the level of the gate voltage VG through pumping. When the fourth enable signal EN4 is deactivated (e.g., to the low level), the charge pump block 179 may stop pumping and may not change the level of the gate voltage VG. Pumping may include taking charges from a power supply in sync with the first to third clock signals CK1 to CK3 from the clock generator 177 and pumping these charges to the output load, i.e. increase the level of the gate voltage VG.

The charge pump block 179 may include first to third charge pumps P1 to P3. The first charge pump P1 may directly receive the first clock signal CK1 from the clock generator 177. The first charge pump P1 may pump the gate voltage VG in response to the first clock signal CK1.

The second and third charge pumps P2 and P3 may respectively receive the second and third clock signals CK2 and CK3 through the pump transistor block 178. The second charge pump P2 may pump the gate voltage VG in response to the second clock signal CK2. If the second clock signal CK2 is not received, the second charge pump P2 may stop pumping.

The third charge pump P3 may pump the gate voltage VG in response to the third clock signal CK3. If the third clock signal CK3 is not received, the third charge pump P3 may stop pumping.

A pumping capacity of the charge pump block 179 may be adjusted by the pump transistor block 178. For example, pumping capacities of the second and third charge pumps P2 and P3 may be applied or may not be applied to the whole pumping capacity of the charge pump block 179 by the pump transistor block 178.

The pump transistor block 178 may adjust the pumping capacity of the charge pump block 179 by applying or not applying the pumping capacities of the second and third charge pumps P2 and P3 to the pumping capacity of the charge pump block 179. The pump transistor block 178 includes a first pump transistor PT1 and a second pump transistor PT2 that are controlled by a second trim signal T2. In other words, the pump transistor block 178 may control the amount of charge pumped by the charge pumps P1 to P3.

The first pump transistor PT1 may be connected between the second charge pump P2 and the clock generator 177 and may transfer or block the second clock signal CK2 in response to the second trim signal T2. The second pump transistor PT2 may be connected between the third charge pump P3 and the clock generator 177 and may transfer or block the third clock signal CK3 in response to the second trim signal T2.

Some embodiments described as the charge pump block 179 include the first to third charge pumps P1 to P3 and the pump transistor block 178 includes the first and second pump transistors PT1 and PT2. However, the number of charge pumps included in the charge pump block 179 and the number of pump transistors included in the pump transistor block 178 are not limited thereto.

The gate voltage controller 180 may receive the first enable signal EN1 indicating a write operation. When the first enable signal EN1 is activated (e.g., to the low level) and a write voltage is necessary, the gate voltage controller 180 may activate the second enable signal EN2 (e.g., to the low level) and may activate the third enable signal EN3 (e.g., to the high level).

The gate voltage controller 180 may output the first to third trim signals T1 to T3 depending on information stored in the external device (e.g., the memory controller or any other component in the control logic 160) or in internal storage. The gate voltage controller 180 may adjust the first trim signal T1 to adjust a resistance value of the reference resistance element 173.

The gate voltage controller 180 may adjust the second trim signal T2 to adjust a pumping capacity of the charge pump block 179. The gate voltage controller 180 may adjust the third trim signal T3 to adjust a level of the reference voltage VREF.

If the comparison voltage VC of the comparison node NC is lower than the reference voltage VREF, the comparator 176 may activate the fourth enable signal EN4 (e.g., to the high level). Charge pumps, which are selected by the second trim signal T2, from among the charge pumps P1 to P3 may pump the gate voltage VG in response to the activation of the fourth enable signal EN4.

If the comparison voltage VC of the comparison node NC is not lower than the reference voltage VREF, the comparator 176 may deactivate the fourth enable signal EN4 (e.g., to the low level). The charge pumps P1 to P3 may stop pumping the gate voltage VG. The gate voltage VG may gradually decrease due to leakage, consumption by parasitic resistance, etc.

That is, the charge pumps P1 to P3 may maintain the gate voltage VG at a target level depending on a result of comparing the reference voltage VREF and the comparison voltage VC. For example, the target level of the gate voltage VG may be higher than the power supply voltage VDD. The gate transistor 171 may operate in a saturation mode by the gate voltage VG.

The capacitor 181 is connected between the gate node NG and the ground node. The capacitor 181 provides capacitance to the gate node NG. For example, the capacitor 181 may be implemented with a transistor having a gate connected to the gate node NG, and a source and a drain connected to the ground node.

Since the gate voltage VG is higher than the power supply voltage VDD, the gate transistor 171 may transfer the power supply voltage VDD to the transmission gate 172 without a substantial voltage drop or with a very small voltage drop. That is, the power supply voltage VDD may be transferred to the reference resistance element 173 without a substantial voltage drop or with a very small voltage drop.

Figure 5:
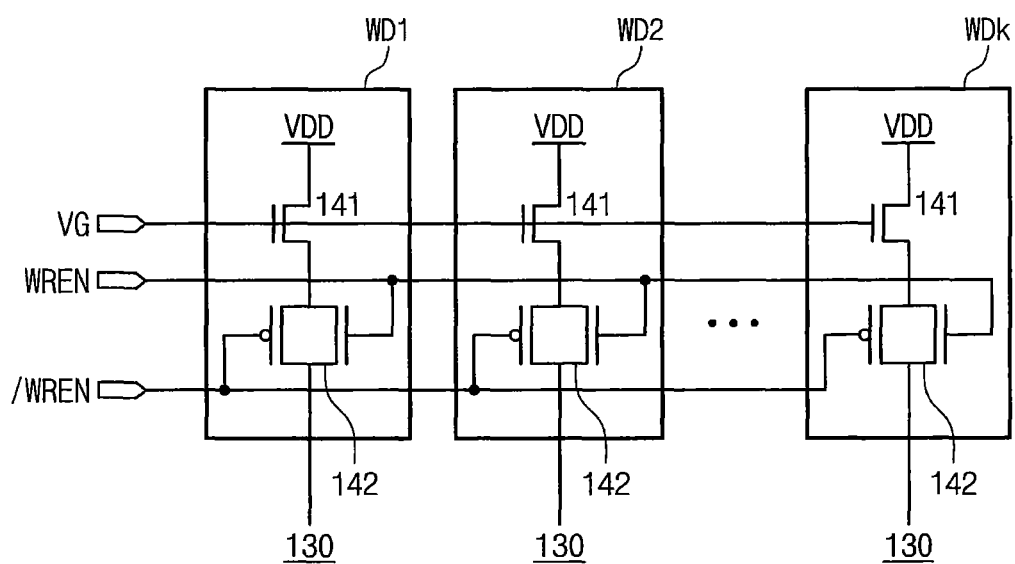
FIG. 5 illustrates an example of write drivers according to some embodiments of the present inventive concepts.

FIG. 5 illustrates an example of the write drivers WD1 to WDk. Referring to FIGS. 1, 4, and 5, the write drivers WD1 to WDk may have the same or similar structures. Each of the write drivers WD1 to WDk includes a write transistor 141 and a write transmission gate 142.

The write transistor 141 of each of the write drivers WD1 to WDk may receive the gate voltage VG from the voltage generator 170. The write transistor 141 may have the same or similar structure and the same or similar size as the gate transistor 171. The write transistor 141 may be an NMOS transistor.

Since the gate voltage VG is higher than the power supply voltage VDD, the write transistor 141 may operate in the saturation mode. Like the gate transistor 171, the write transistor 141 may transfer the power supply voltage VDD as a write voltage to the write transmission gate 142 without a substantial voltage drop or with a very small voltage drop.

The write transmission gate 142 may have a first end connected to the write transistor 141, a second end connected to the column decoder 130, and gates to which the write enable signal WREN and the inverted write enable signal /WREN are respectively applied. The inverted write enable signal /WREN may correspond to an inverted version of the write enable signal WREN.

The write transmission gate 142 may have a structure in which a PMOS transistor operating in response to the inverted write enable signal /WREN and an NMOS transistor operating in response to the write enable signal WREN are connected in parallel.

The write transmission gate 142 may have the same or similar structure and the same or similar size as the transmission gate 172. Like the transmission gate 172, the power supply voltage VDD may be supplied to a memory cell MC through the column decoder 130 and a bit line (or a source line) as a write voltage without a substantial voltage drop or with a very small voltage drop.

In some embodiments, the gate voltage controller 180 may control the first trim signal T1 such that a resistance value of the reference resistance element 173 corresponds to (e.g., is identical to or approximates to) a resistance value of a memory cell.

For example, in a write operation of switching a state of a memory cell from a first state to a second state, the gate voltage controller 180 may control the first trim signal T1 such that a resistance value of the reference resistance element 173 corresponds to a resistance value of the memory cell having the first state. In a write operation of switching a state of a memory cell from the second state to the first state, the gate voltage controller 180 may control the first trim signal T1 such that a resistance value of the reference resistance element 173 corresponds to a resistance value of the memory cell having the second state.

If the resistance value of the reference resistance element 173 is adjusted to correspond to the resistance value of the memory cell, a voltage transferred to the memory cell may be substantially identical or similar to the comparison voltage VC. Accordingly, in the write operation, voltages transferred to memory cells may be uniformly adjusted to a target level.

The gate voltage controller 180 may adjust a level of the reference voltage VREF by using the third trim signal T3. The level of the gate voltage VG is adjusted such that the comparison voltage VC is identical to the reference voltage VREF. Accordingly, levels of voltages to be transferred to memory cells in a write operation may be adjusted by adjusting the reference voltage VREF.

The write transistor 141 may form a source follower with regard to the gate voltage VG. Accordingly, the write transistor 141 may have low output impedance and a fast adjustment and recovery speed without including an element, which occupies the large area, such as a capacitor. This means that the area of the write drivers WD1 to WDk may be reduced and the adjustment and recovery speed is improved.

Since the gate voltage VG is higher than the power supply voltage VDD, the write transistor 141 may operate in the saturation mode, and thus, the power supply voltage VDD may be supplied as a write voltage without a substantial voltage drop or with a very small voltage drop. That is, a write voltage of a high level that approximates to the power supply voltage VDD may be secured. Also, the voltage headroom issue that is capable of occurring in the write transistor 141 is solved.

Figure 6:
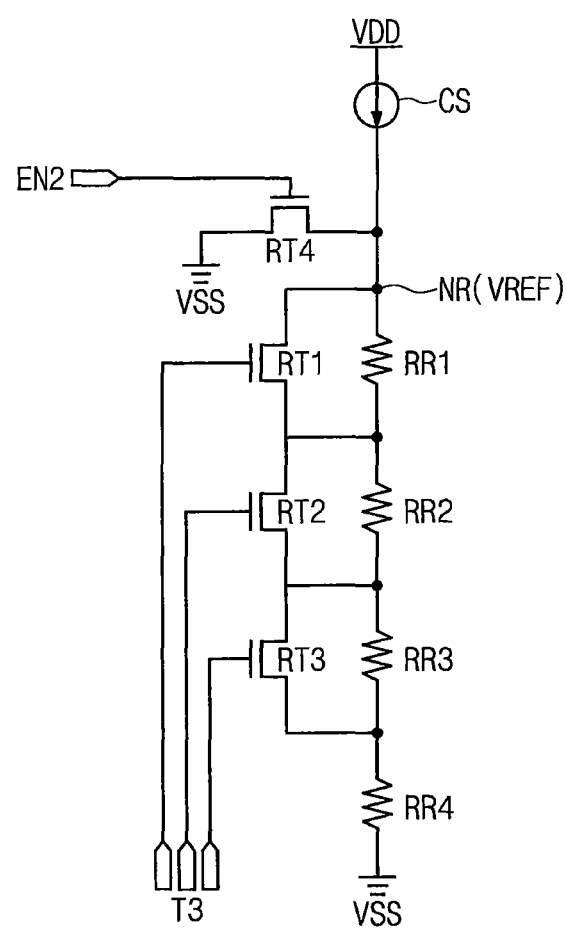
FIG. 6 illustrates an example of a reference voltage generator according to some embodiments of the present inventive concepts.

FIG. 6 illustrates an example of the reference voltage generator 175. Referring to FIGS. 4 and 6, the reference voltage generator 175 may include first to fourth reference resistors RR1 to RR4, first to fourth reference transistors RET1 to RET4, and a current source CS.

The first to fourth reference resistors RR1 to RR4 are serially connected between a reference node NR and the ground node supplied with the ground voltage VSS. The current source CS may be connected between the power node supplied with the power supply voltage VDD and the reference node NR.

The first to third reference transistors RET1 to RET3 may be connected in parallel with the first to third reference resistors RR1 to RR3, respectively, and may be controlled by the third trim signal T3. The fourth reference transistor RET4 is connected between the reference node NR and the ground node and is controlled by the second enable signal EN2.

If the second enable signal EN2 is deactivated (e.g., to the high level), the reference node NR is connected to the ground node through the fourth reference transistor RET4. Accordingly, the reference voltage VREF may become the ground voltage VSS.

If the second enable signal EN2 is activated (e.g., to the low level), the reference node NR is electrically separated from the ground node. A current that the current source CS outputs may generate the reference voltage VREF of the reference node NR.

If the first to third reference transistors RET1 to RET3 are turned on, resistance values of the first to third reference resistors RR1 to RR3 may not be applied. Accordingly, the reference voltage VREF decreases. If the first to third reference transistors RET1 to RET3 are turned off, the resistance values of the first to third reference resistors RR1 to RR3 may be applied. Accordingly, the reference voltage VREF increases.

Figure 7:
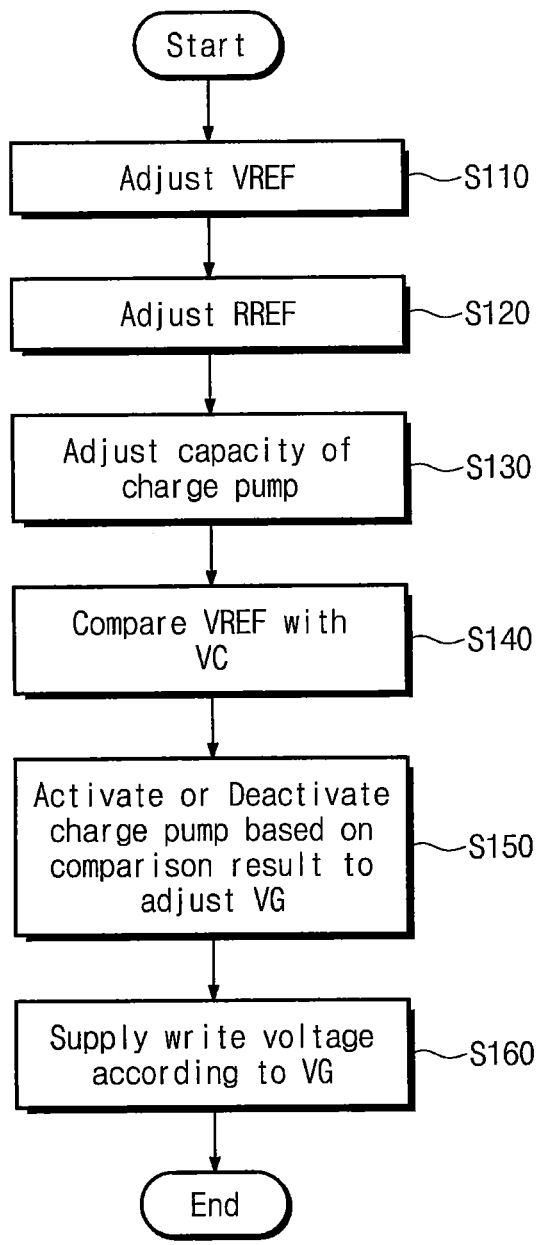
FIG. 7 is a flowchart illustrating an operating method of a memory device according to some embodiments of the present inventive concept.

FIG. 7 is a flowchart illustrating an operating method of the memory device 100 according to some embodiments of the inventive concept. Referring to FIGS. 1, 4, 5, and 7, in operation S110, the gate voltage controller 180 may adjust a level of the reference voltage VREF by using the third trim signal T3.

In operation S120, the gate voltage controller 180 may adjust a resistance value of the reference resistance element 173 by using the first trim signal T1. For example, the gate voltage controller 180 may control the resistance value of the reference resistance element 173 so as to correspond to a resistance value of a memory cell.

In operation S130, the gate voltage controller 180 may adjust a pumping capacity of the charge pump block 179. As the pumping capacity of the charge pump block 179 increases, a speed at which the gate voltage VG is adjusted to a target level increases. As the pumping capacity of the charge pump block 179 decreases, a ripple that occurs when the gate voltage VG is adjusted to the target level decreases.

The gate voltage controller 180 may adjust a pumping capacity of the charge pump block 179 in consideration of both a speed of adjusting the gate voltage VG and a ripple of the gate voltage VG. For example, at the beginning when the gate voltage VG starts to be generated, the gate voltage controller 180 may speed up adjusting the gate voltage VG higher by increasing a pumping capacity of the charge pump block 179 through the second trim signal T2.

If the gate voltage VG increases, for example, if the gate voltage VG increases during a given time, increases to a target level, or increases a level that is identical to or higher than a specific level lower than the target level, the gate voltage controller 180 may decrease the pumping capacity, and thus, a ripple of the gate voltage VG decreases.

In operation S150, the comparator 176 may compare the reference voltage VREF and the comparison voltage VC. In operation S150, the comparator 176 may activate or deactivate the charge pumps P1 to P3 depending on a result of the comparison, and thus, the gate voltage VG may be adjusted to the target level.

In operation S160, the write drivers WD1 to WDk may supply a write voltage to memory cells MC by using the gate voltage VG. For example, the write drivers WD1 to WDk may supply the power supply voltage VDD as a write voltage without a substantial voltage drop or with a very small voltage drop.

Figure 8:
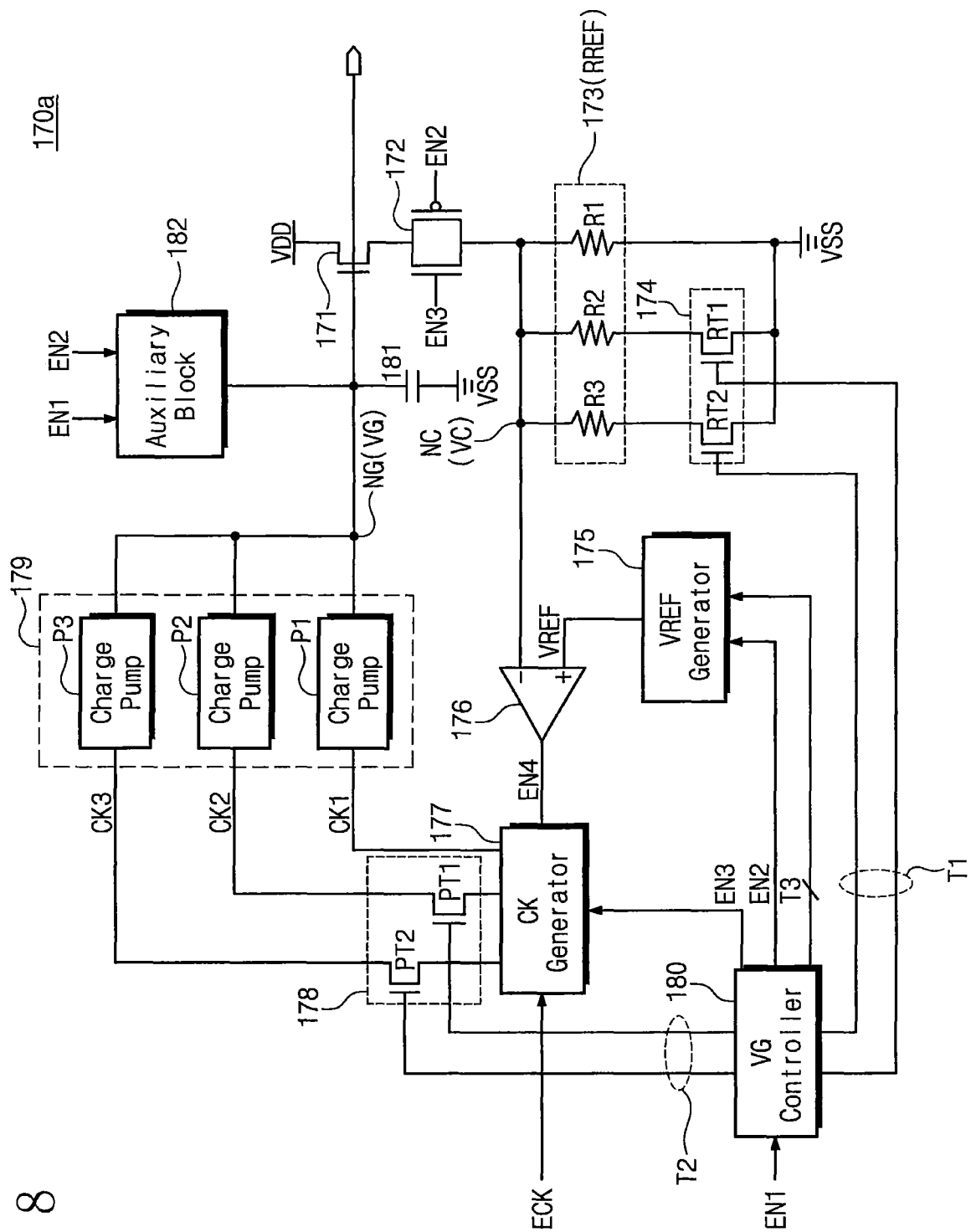
FIG. 8 illustrates an example of a voltage generator that further includes an auxiliary block according to some embodiments of the present inventive concepts.

FIG. 8 illustrates an example of a voltage generator 170a that further includes an auxiliary block 182. Referring to FIGS. 1, 4, and 8, the voltage generator 170a includes the gate transistor 171, the transmission gate 172, the reference resistance element (RREF) 173, the resistance transistor block 174, the reference voltage generator 175, the comparator 176, the clock generator 177, the pump transistor block 178, the charge pump block 179, the gate voltage controller 180, the capacitor 181, and/or the auxiliary block 182.

The gate transistor 171, the transmission gate 172, the reference resistance element (RREF) 173, the resistance transistor block 174, the reference voltage generator 175, the comparator 176, the clock generator 177, the pump transistor block 178, the charge pump block 179, the gate voltage controller 180, and the capacitor 181 have the same or similar structure as described with reference to FIG. 4 and operates the same or in a similar manner as described with reference to FIG. 4, and thus, a description thereof will not be repeated here.

Compared with the voltage generator 170 of FIG. 4, the voltage generator 170a may further include the auxiliary block 182. The auxiliary block 182 may operate in response to the first enable signal EN1 and the second enable signal EN2. The auxiliary block 182 may precharge the gate voltage VG in response to the first and second enable signals EN1 and EN2. For example, when a write operation starts, the auxiliary block 182 may precharge the gate voltage VG with the power supply voltage VDD.

Also, the auxiliary block 182 may function as a load that drains a current from the gate node NG. For example, since the charge pump block 179 increases the gate voltage VG and the auxiliary block 182 decreases the gate voltage VG, the gate voltage VG may be more easily adjusted to a target level.

Figure 9:
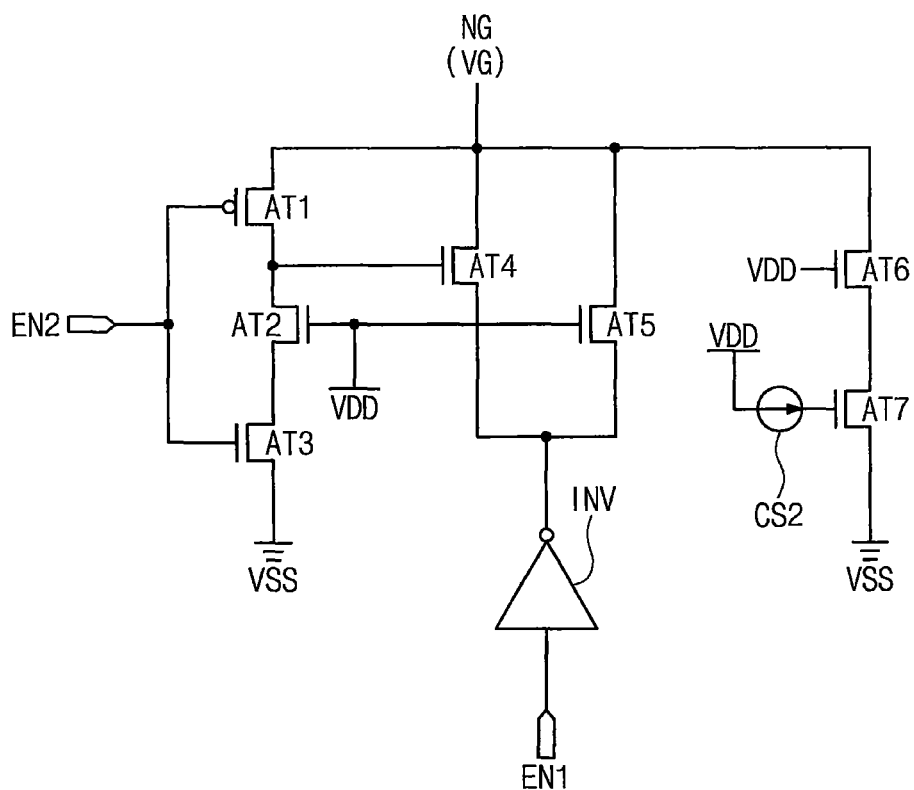
FIG. 9 illustrates an example of an auxiliary block according to some embodiments of the present inventive concepts.

FIG. 9 illustrates an example of the auxiliary block 182. Referring to FIG. 9, the auxiliary block 182 includes first to sixth auxiliary transistors AT1 to AT7, an inverter INV, and a second current source CS2. The first auxiliary transistor AT1 has a first end connected to the gate node NG, a second end connected to the second auxiliary transistor AT2, and a gate to which the second enable signal EN2 is applied. The first auxiliary transistor AT1 may be a PMOS transistor.

The second auxiliary transistor AT2 has a first end connected to the second end of the first auxiliary transistor AT1, a second end connected to the third auxiliary transistor AT3, and a gate to which the power supply voltage VDD is supplied. The second auxiliary transistor AT2 may be an NMOS transistor. The third auxiliary transistor AT3 has a first end connected to the second end of the second auxiliary transistor AT2, a second end to which the ground voltage VSS is supplied, and a gate to which the second enable signal EN2 is applied. The third auxiliary transistor AT3 may be an NMOS transistor.

The fourth auxiliary transistor AT4 has a first end connected to the gate node NG, a second end connected to an output of the inverter INV, and a gate connected to the second end of the first auxiliary transistor AT1 and the first end of the second auxiliary transistor AT2. The fifth auxiliary transistor AT5 has a first end connected to the gate node NG, a second end connected to the output of the inverter INV, and a gate to which the power supply voltage VDD is supplied. The fourth and fifth auxiliary transistors AT4 and AT5 may be NMOS transistors.

The inverter INV may invert and output the first enable signal EN1. The first to fifth auxiliary transistors AT1 to AT5 and the inverter INV may function as a precharge circuit that increases a voltage of the gate node NG to the power supply voltage VDD upon generating the gate voltage VG.

The sixth auxiliary transistor AT6 has a first end connected to the gate node NG, a second end connected to the seventh auxiliary transistor AT7, and a gate to which the power supply voltage VDD is supplied. The seventh auxiliary transistor AT7 has a first end connected to the second end of the sixth auxiliary transistor AT6, a second end to which the ground voltage VSS is supplied, and a gate to the second current source CS2. The sixth and seventh auxiliary transistors AT6 and AT7 may be NMOS transistors.

The second current source CS2 is connected between the power node supplied with the power supply voltage VDD and the gate of the seventh auxiliary transistor AT7. The second current source CS2 may supply a current to the gate of the seventh auxiliary transistor AT7. Due to the supplied current, a voltage of the gate of the seventh auxiliary transistor AT7 may increase. That is, the sixth and seventh auxiliary transistors AT6 and AT7 are always turned on and may function as a discharge circuit that discharges a voltage of the gate node NG.

Figure 10:
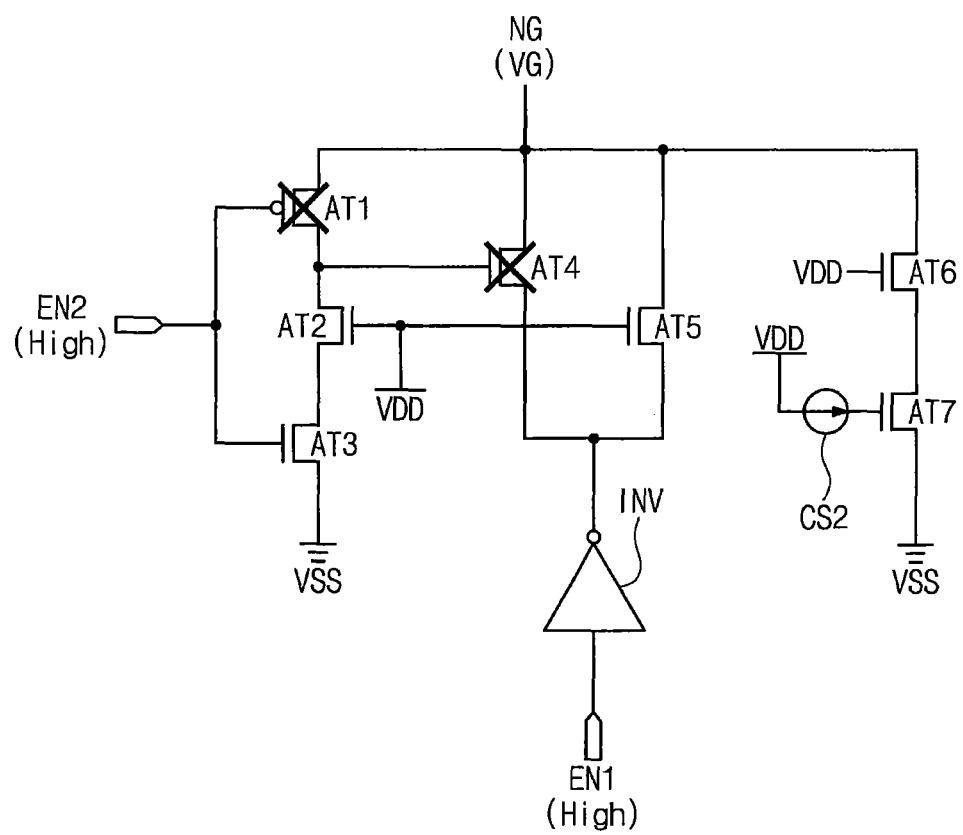
FIG. 10 illustrates a state of an auxiliary block when a first enable signal and the second enable signal are deactivated according to some embodiments of the present inventive concepts.

FIG. 10 illustrates a state of the auxiliary block 182 when the first enable signal EN1 and the second enable signal EN2 are deactivated. Referring to FIG. 10, the first enable signal EN1 may have the high level, and the second enable signal EN2 may have the high level. The first auxiliary transistor AT1 may be turned off depending on the second enable signal EN2.

Since the third auxiliary transistor AT3 is turned on by the second enable signal EN2, the ground voltage VSS of the ground node may be provided to the gate of the fourth auxiliary transistor AT4, and thus, the fourth auxiliary transistor AT4 is turned off. The inverter INV may output the low level depending on the first enable signal EN1.

The output of the inverter INV is provided to the gate node NG through the fifth auxiliary transistor AT5. The inverter INV may decrease the gate voltage VG of the gate node NG to the ground voltage VSS. That is, when the first and second enable signals EN1 and EN2 are deactivated, the gate voltage VG may be the ground voltage VSS.

Figure 11:
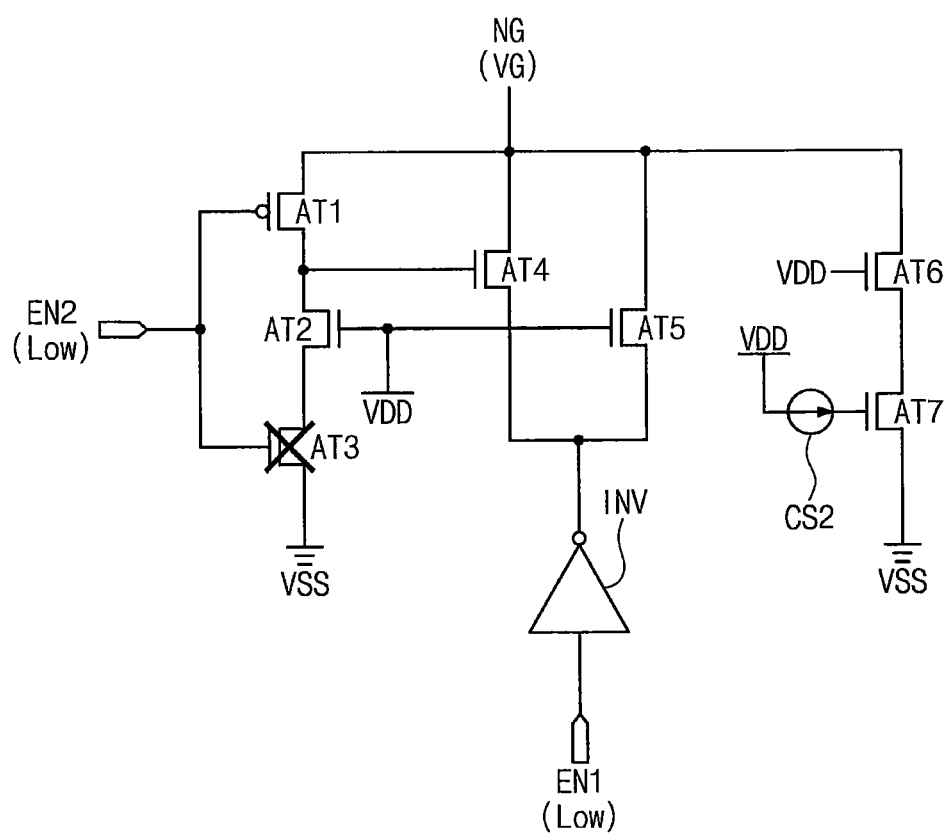
FIG. 11 illustrates a state of an auxiliary block when a first enable signal and the second enable signal are deactivated according to some embodiments of the present inventive concept.

FIG. 11 illustrates a state of the auxiliary block 182 when the first enable signal EN1 and the second enable signal EN2 are activated. Referring to FIG. 11, the first enable signal EN1 may have the low level, and the second enable signal EN2 may have the low level. The third auxiliary transistor AT3 may be turned off depending on the second enable signal EN2.

The output of the inverter INV is provided to the gate node NG through the fifth auxiliary transistor AT5. Since the first enable signal EN1 has the low level, the inverter INV may output the high level. That is, the inverter INV may increase the gate voltage VG of the gate node NG to the high level (e.g., the power supply voltage VDD).

The first auxiliary transistor AT1 may be turned on depending on the second enable signal EN2. The gate voltage VG is provided to the gate of the fourth auxiliary transistor AT4 through the first auxiliary transistor AT1. That is, if the gate voltage VG starts to increase by the inverter INV, the fourth auxiliary transistor AT4 may be turned on by the gate voltage VG. Accordingly, the inverter INV may increase the gate voltage VG more quickly through the fourth and fifth auxiliary transistors AT4 and AT5.

The charge pump block 179 may pump the gate voltage VG to a level higher than the power supply voltage VDD. In some embodiments, when the gate voltage VG is higher than the power supply voltage VDD, the inverter INV may function as a load that decreases the gate voltage VG to the power supply voltage VDD.

Figure 12:
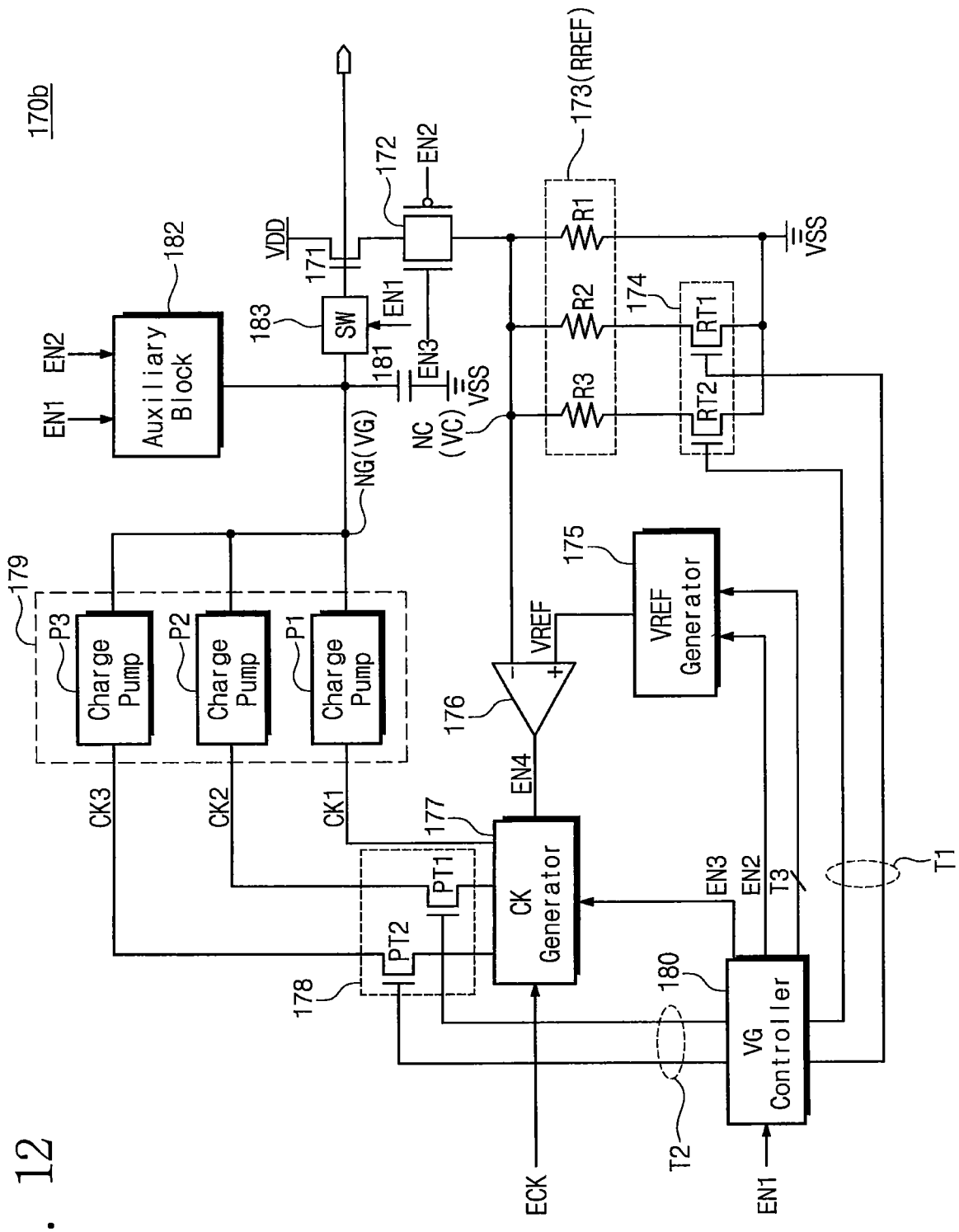
FIG. 12 illustrates an example of a voltage generator that further includes a switch according to some embodiments of the present inventive concept.

FIG. 12 illustrates an example of a voltage generator 170b that further includes a switch SW. Referring to FIGS. 1, 8, and 12, the voltage generator 170b includes the gate transistor 171, the transmission gate 172, the reference resistance element (RREF) 173, the resistance transistor block 174, the reference voltage generator 175, the comparator 176, the clock generator 177, the pump transistor block 178, the charge pump block 179, the gate voltage controller 180, the capacitor 181, the auxiliary block 182, and/or a switch (SW) 183.

The gate transistor 171, the transmission gate 172, the reference resistance element (RREF) 173, the resistance transistor block 174, the reference voltage generator 175, the comparator 176, the clock generator 177, the pump transistor block 178, the charge pump block 179, the gate voltage controller 180, the capacitor 181, and the auxiliary block 182 have the same or a similar structure as described with reference to FIG. 8 and operates the same or in a similar manner as described with reference to FIG. 8, and thus, a description thereof will not be repeated here.

Compared with the voltage generator 170a of FIG. 8, the voltage generator 170b may further include the switch 183. The switch 183 may electrically connect, electrically isolate, or separate the gate node NG and the write and sense block 140 of FIG. 1 in response to the first enable signal EN1. That is, the switch 183 may control whether to transfer the gate voltage VG to the write and sense block 140 of FIG. 1.

Figure 13:
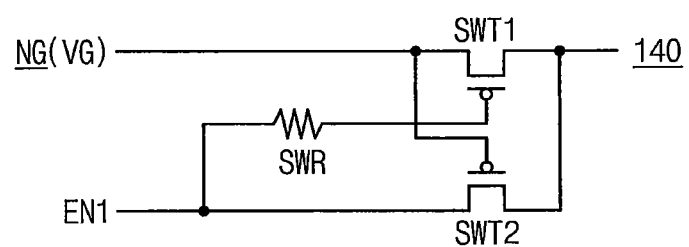
FIG. 13 illustrates an example of a switch of FIG. 12 according to some embodiments of the present inventive concept.

FIG. 13 illustrates an example of the switch 183 of FIG. 12. Referring to FIGS. 12 and 13, the switch 183 includes a first switch transistor SWT1, a second switch transistor SWT2, and a switch resistor SWR.

The first switch transistor SWT1 has a first end connected to the gate node NG, a second end connected to the write and sense block 140, and a gate connected to the switch resistor SWR. The first switch transistor SWT1 may be a PMOS transistor.

The second switch transistor SWT2 has a first end to which the first enable signal EN1 is applied, a second end connected to the write and sense block 140, and a gate connected to the gate node NG or the first end of the first switch transistor SWT1. The second switch transistor SWT2 may be a PMOS transistor.

The switch resistor SWR may be connected between the gate of the first switch transistor SWT1 and the first end of the second switch transistor SWT2. The switch resistor SWR may transfer the first enable signal EN1 to the gate of the first switch transistor SWT1.

When the first enable signal EN1 is in an inactive state, that is, when the first enable signal EN is at the high level, the gate voltage VG of the gate node NG may be a ground voltage (refer to FIG. 10). The first switch transistor SWT1 is turned off depending on the first enable signal EN1. The second switch transistor SWT2 is turned on depending on the gate voltage VG.

When the first enable signal EN1 is in an active state, that is, when the first enable signal EN is at the low level, the gate voltage VG of the gate node NG may increase a level higher than the power supply voltage VDD passing through the power supply voltage VDD from the ground voltage VSS (e.g., through a precharge operation).

The first switch transistor SWT1 is turned on depending on the first enable signal EN1. That is, the first switch transistor SWT1 transfers the gate voltage VG to the write and sense block 140. When the gate voltage VG is a power supply voltage, the second switch transistor SWT2 is turned off.

That is, when the gate voltage VG is low, both the first switch transistor SWT1 and the second switch transistor SWT2 transmit the gate voltage VG to the write and sense block 140. Accordingly, when the gate voltage VG is low, an increase in the gate voltage VG may be accelerated.

In the embodiments described above, components of the memory device 100 is above described by using the terms "first", "second", "third", and the like. However, the terms "first", "second", "third", and the like may be used to distinguish components from each other and do not limit the inventive concept. For example, the terms "first", "second", "third", and the like do not involve an order or a numerical meaning of any form.

In the above-described embodiments, components according to embodiments of the inventive concept are referred to by using the term "block". The "block" may be implemented with various hardware devices, such as an integrated circuit, an application specific IC (ASCI), a field programmable gate array (FPGA), and a complex programmable logic device (CPLD), software, such as firmware and applications driven in hardware devices, or a combination of a hardware device and software. Also, "block" may include circuits or intellectual property (IP) implemented with semiconductor devices.

According to the inventive concept, a write voltage is generated based on a source follower structure. Accordingly, a memory device, which does not need a separate high-capacity capacitor for securing low output impedance and a fast adjustment and recovery speed and generates the write voltage with the reduced area, the reduced power, and an improved adjustment and recovery speed, and an operating method of the memory device are provided.

According to the inventive concept, the write voltage is generated by using a voltage that is pumped by a charge pump to be higher than a power supply voltage. Accordingly, the memory device, which does not have the problem of voltage headroom and is able to secure a higher write voltage, and an operating method of the memory device are provided.

As used herein, the term "and/or" includes any and all combinations of one or more of the associated listed items. Expressions such as "at least one of," when preceding a list of elements, modify the entire list of elements and do not modify the individual elements of the list.

While the inventive concept has been described with reference to example embodiments thereof, it will be apparent to those of ordinary skill in the art that various changes and modifications may be made thereto without departing from the spirit and scope of the inventive concept as set forth in the following claims.

What is claimed is:

1. A magnetic random access memory device comprising:
    a memory cell array comprising a plurality of memory cells, each of the plurality of memory cells comprising a magnetic memory cell;
    a row decoder connected to the memory cell array through a plurality of word lines;
    a column decoder connected to the memory cell array through a plurality of bit lines and a plurality of source lines;
    a write driver configured to generate a write voltage to a bit line of the plurality of bit lines, wherein the bit line is selected by the column decoder, from among the plurality of bit lines by using a gate voltage in a write operation; and
    control logic configured to generate the gate voltage,
    wherein the gate voltage is higher than the write voltage,
    wherein the magnetic memory cell comprises:
        a variable resistance element a first state having a first resistance value and a second state having a second resistance value, the variable resistance element comprising:
            a free layer having variable magnetization direction and connected to a corresponding bit line among the plurality of bit lines;
            a pinned layer having a fixed magnetization direction; and
            a tunneling layer between the free layer and the pinned layer; and
        a selection transistor comprising:
            a gate connected to a corresponding word line among the plurality of word lines;
            a first terminal connected to a corresponding source line among the plurality of source lines; and
            a second terminal connected to the variable resistance element.

2. The magnetic random access memory device of claim 1, wherein the control logic comprises:
    a charge pump configured to generate the gate voltage; and
    a controller configured to adjust a capacity of the charge pump.

3. The magnetic random access memory device of claim 2, wherein the charge pump comprises a first charge pump, a second charge pump, and a third charge pump, and wherein the control logic further comprises:
    a clock generator configured to generate a first clock signal, a second clock signal, and a third clock signal that are respectively supplied to the first charge pump, the second charge pump, and the third charge pump.

4. The magnetic random access memory device of claim 3, wherein the first clock signal is continuously supplied to the first charge pump while the clock generator is activated, and wherein the control logic further comprises:
    a first pump transistor and a second pump transistor that are configured to transfer or block the second clock signal and the third clock signal to the second charge pump and the third charge pump respectively under control of the controller.

5. The magnetic random access memory device of claim 1, wherein the control logic comprises:
    a gate transistor configured to transfer a power supply voltage in response to the gate voltage;

a transmission gate connected in parallel between the gate transistor and a comparison node and configured to operate in response to first and second enable signals, respectively; and
a reference resistance element connected between the comparison node and a ground node.

6. The magnetic random access memory device of claim 5, wherein the control logic further comprises:
a controller configured to adjust a resistance value of the reference resistance element to the first resistance value.

7. The magnetic random access memory device of claim 6, wherein the reference resistance element comprises a first resistor, a second resistor, and a third resistor, wherein the first resistor is connected between the comparison node and the ground node, and wherein the control logic further comprises:
a first resistance transistor and a second resistance transistor configured to electrically connect or electrically isolate the second resistor and the third resistor with or from the ground node under control of the controller.

8. The magnetic random access memory device of claim 5, wherein the control logic further comprises:
a reference voltage generator configured to generate a reference voltage;
a comparator configured to compare a comparison voltage of the comparison node and the reference voltage and configured to output an enable signal based on a result of the compare; and
a charge pump configured to generate the gate voltage, wherein the charge pump is activated or deactivated in response to the enable signal.

9. The magnetic random access memory device of claim 8, wherein the control logic further comprises:
a clock generator configured to be activated or deactivated in response to the enable signal and configured to supply a clock signal to the charge pump when activated.

10. The magnetic random access memory device of claim 8, further comprising:
a controller configured to control the reference voltage generator to adjust a level of the reference voltage.

11. The magnetic random access memory device of claim 1, wherein the write driver comprises:
a write transistor configured to transfer a power supply voltage as the write voltage in response to the gate voltage.

12. The magnetic random access memory device of claim 11, wherein the control logic is further configured to generate a first write enable signal and a second write enable signal in the write operation, and wherein the write driver further comprises:
a write transmission gate connected between the write transistor and the column decoder and configured to operate in response to the first and second write enable signals.

13. The magnetic random access memory device of claim 1, wherein the control logic comprises:
an auxiliary block configured to precharge the gate voltage when the write operation starts and to discharge the gate voltage when the write operation is completed.

14. A magnetic random access memory device comprising:
a memory cell array comprising a plurality of memory cells, each of the plurality of memory cells comprising a magnetic memory cell;
a row decoder connected to the memory cell array through a plurality of word lines;
a column decoder connected to the memory cell array through a plurality of bit lines and/or a plurality of source lines;
a write driver configured to generate a write voltage to a bit line of the plurality of bit lines, which is selected by the column decoder, from among the plurality of bit lines by using a gate voltage in a write operation; and
control logic configured to generate the gate voltage, wherein the control logic comprises:
a reference resistance element connected between a comparison node and a ground node;
a transmission gate connected to the comparison node and configured to operate in response to first and second enable signals;
a gate transistor connected between a power node and the transmission gate and configured to operate in response to the gate voltage;
a comparator configured to compare a reference voltage and a comparison voltage of the comparison node and output a third enable signal in response to a result of the compare; and
a charge pump configured to generate the gate voltage in response to the third enable signal.

15. The magnetic random access memory device of claim 14, wherein the write driver comprises:
a write transistor configured to transfer a power supply voltage as the write voltage in response to the gate voltage; and
a write transmission gate connected between the write transistor and the column decoder.

16. The magnetic random access memory device of claim 15,
wherein a size of the gate transistor is similar to a size of the write transistor, and
wherein a size of the transmission gate is similar to a size of the write transmission gate.

17. The magnetic random access memory device of claim 15, wherein the power supply voltage is supplied to the plurality of memory cells as the write voltage without a substantial voltage drop.

18. The magnetic random access memory device of claim 15, wherein the gate voltage is higher than the power supply voltage.

19. The magnetic random access memory device of claim 14, wherein the magnetic memory cell comprises:
a variable resistance element configured to switch between a first state having a first resistance value and a second state having a second resistance value, wherein the variable resistance element comprises:
a free layer having variable magnetization direction and connected to a corresponding bit line among the plurality of bit lines;
a pinned layer having a fixed magnetization direction; and
a tunneling layer between the free layer and the pinned layer; and
a selection transistor comprising:
a gate connected to a corresponding word line among the plurality of word lines;
a first terminal connected to a corresponding source line among the plurality of source lines; and
a second terminal connected to the variable resistance element, wherein a resistance value of the reference resistance element is adjusted to one of the first resistance value and the second resistance value.

20. A method of operating a magnetic random access memory device comprising magnetic memory cells, the method comprising:
adjusting a reference voltage;
adjusting a resistance value of a reference resistance element from a first resistance value to a second resistance value;
adjusting a capacity of a charge pump from a first capacity to a second capacity;
comparing a comparison voltage generated by the reference resistance element having the second resistance value with the reference voltage;
activating or deactivating the charge pump having the second capacity based on a result of the comparing, in order to adjust a gate voltage from a first gate voltage to a second gate voltage; and
supplying a write voltage to one or more of the magnetic memory cells responsive the second gate voltage.

* * * * *